United States Patent [19]

Taylor

[11] 4,192,016

[45] Mar. 4, 1980

[54] CMOS-BIPOLAR EAROM

[75] Inventor: David L. Taylor, Melbourne, Fla.

[73] Assignee: Harris Semiconductor, Melbourne, Fla.

[21] Appl. No.: 953,316

[22] Filed: Oct. 20, 1978

[51] Int. Cl.² ............................................. G11C 11/40
[52] U.S. Cl. ...................................... 365/163; 307/205
[58] Field of Search ................... 365/163; 317/235 R, 317/234 J, 234 N; 307/205

[56] References Cited

U.S. PATENT DOCUMENTS

| | | | |
|---|---|---|---|
| 3,601,630 | 8/1971 | Redwine | 365/183 |
| 3,649,843 | 3/1972 | Redwine et al. | 365/183 |
| 3,721,964 | 3/1973 | Barrett et al. | 365/183 |
| 3,792,319 | 2/1974 | Tsang | 365/183 |
| 3,862,367 | 1/1975 | Kono et al. | 179/1 A |

Primary Examiner—Terrell W. Fears
Attorney, Agent, or Firm—Leitner, Palan, Martin & Bernstein

[57] ABSTRACT

A memory array having NPN emitter followers with B $V_{EB} > 20$ volts and high threshold electrically alterable devices in each cell, CMOS row and column address buffer drivers and CMOS outputs buffers. The row address buffer includes an emitter follower as the output stage in a Darlington configuration with the array emitter follow capable of carrying high current and voltages for the programming and read modes.

17 Claims, 3 Drawing Figures

CMOS-BIPOLAR EAROM

BACKGROUND OF THE INVENTION

The present invention relates generally to complimentary metal oxide field effect transistors, electrically alterable read only memories and more specifically to such a memory incorporating bipolar transistors in emitter follower configurations.

Previous attempts to fabricate EAROM (Electrically Alterable Read Only Memory) devices have been limited by the thermal characteristics of the amorphous material. Since amorphous material degradation occurs at temperatures around 140°-150° C., the power dissipated by device (e.g. a 1K EAROM) must be kept small. If, for example, a 1K EAROM device was designed to dissipate a nominal power of 500 milliwatts and be packaged in a conventional CERDIP package, the die temperature would be as follows: $T_A$ (ambient temperature) + [$\theta_{JA}$ (junction to air thermal impedance) $\times P_D$ (device power dissipation)]. For a conventional industrial operating temperature of 75° C. and a conventional $\theta_{JA}$ of 80° C./watt, the die temperature would be 115° C. For a military operating temperature of 125° C., the die temperature would be 165° C.

In order to provide devices which can operate up to 125° C., very elaborate packaging schemes (e.g., liquid cooled) have been employed from reducing $\theta_{JA}$. Reduction of $\theta_{JA}$ to the range of 5°-10° C./watt has been achieved. This method has been successful but is extremely expensive.

Another method used for reducing the die temperature has been to reduce the device's power dissipation. For a device power dissipation of 100 milliwatts, an operating temperature of 125° C. and a conventional CERDIP package, a die temperature of 133° C. could be achieved. This reduction in power is viable but is very restrictive with respect to achievable speeds. Whereas a speed of 40-50 nanoseconds for a 1K EAROM could be achieved at a power level of 500 milliwatts nominal, the speed would be degraded to 150-200 nanoseconds at a power level of 100 milliwatts.

In order to provide amorphous material elements which have the capability of operating at high temperatures (e.g., 125° C.), high threshold devices (e.g., 10-15 V) have been employed. In memory arrays where these elements have been used, either collector-base or Schottky diodes have been used due to component breakdown characteristics. The use of these diodes requires that the memory array be isolated, and hence, the achievable memory array size is limited. NPN transistors in an emitter follower configuration do not require surface area for isolation, thereby increasing density, but the low emitter to base breakdown voltage (generally 7 volts) prevents their use with high threshold devices.

The use of field effect transistors reduces power consumption, but they are very slow and their signal capacity is a function of their size. Bipolar transistors are capable of operating quickly and have a far greater signal capacity per unit area than field effect transistors, but they consume substantially greater power. Also bipolar transistors consume static power. The use of emitter followers in CMOS buffers has been described in the prior art, but these buffers generally consume static power.

Thus there exists a need for an EAROM which can satisfy the interrelationship between achievable speed, power, density and operating temperature without the requirement of exotic packaging schemes.

SUMMARY OF THE INVENTION

The present invention achieves a reasonable speed with a minimum power consumption within reasonable operating temperatures and reduced density by the use of an emitter follower output stage for the CMOS address buffers, the use of high threshold switchable amorphous materials in the cells of the memory array, the use of a high emitter to base breakdown voltage NPN emitter follower as the isolation device in each cell of the array and CMOS row address buffers, column address buffer and transmission gates, sense amplifiers and output buffers. The row address buffer includes a CMOS inverter input stage and an emitter follower NPN transistor as the output stage. A second N channel MOS device has its gate connected to the input of the inverter and its drain connected to the emitter of the NPN transistor. The emitter of the address buffer output stage is connected to the bases of the emitter followers in the memory array. During reading modes and programming modes, the buffer emitter follower and the selected memory cell emitter follower are biased to assume a Darlington configuration. The cell emitter follower is formed to have a P− base region and an N+ emitter region so as to have an emitter-base breakdown voltage of greater than 20 volts. By using high threshold switchable elements, for example, greater than ten volts, the temperature stability and reliability of the cell is increased. The memory array includes a common collector for the memory array emitter followers which is positively biased. This eliminates the need for junction isolation of the array devices.

An object of the present invention is to optimize speed, power, density and operating temperatures in an EAROM without the use of exotic packaging schemes.

Another object is to provide a bipolar output stage of a CMOS address buffer without static power consumption.

A further object of the invention is to provide a maximum density memory array by eliminating cell device isolation.

Still another object of the invention is to incorporate an NPN emitter follower configured transistors as the isolation device in a memory cell which has a substantially high emitter-base breakdown voltage.

Other objects, advantages and novel features of the present invention will become apparent from the following detailed description of the invention when considered in conjunction with the accompanying drawings.

A BRIEF DESCRIPTION OF THE DRAWINGS

DESCRIPTION OF THE PREFERRED EMBODIMENTS

Figure 1:
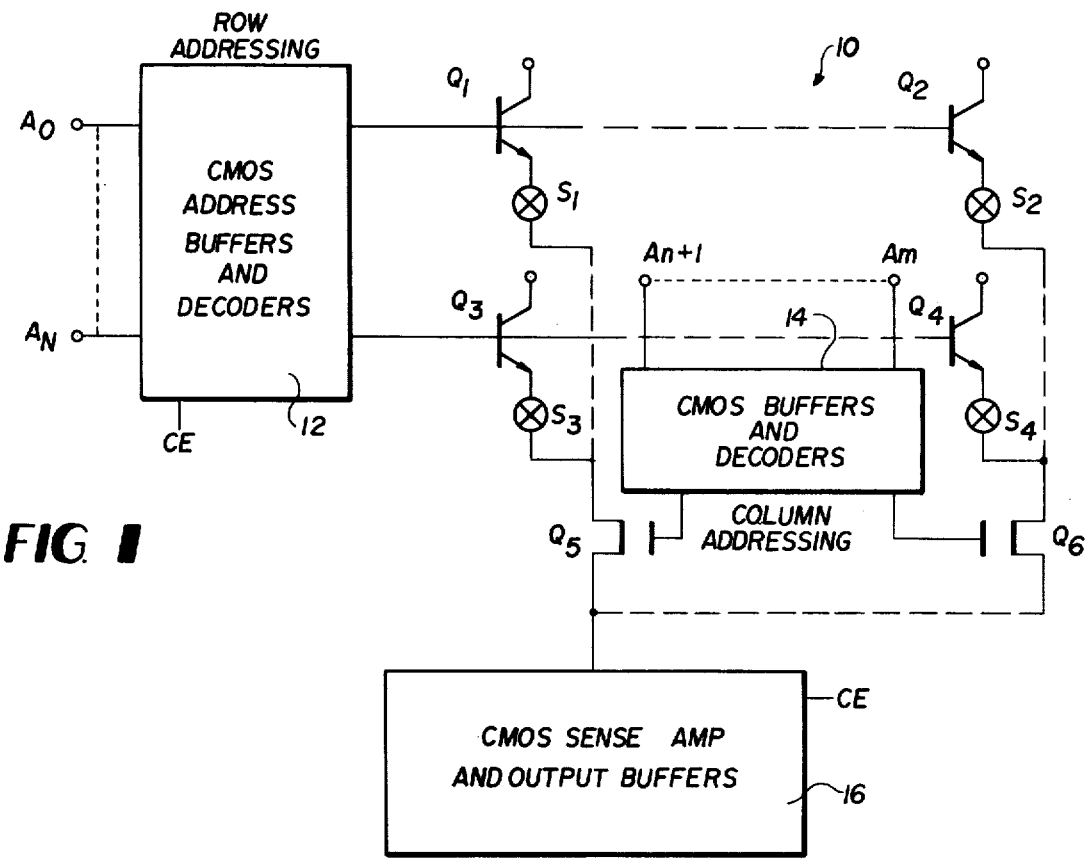
FIG. 1 is a block diagram of a circuit incorporating the principles of the present invention.

FIG. 1, which illustrates the preferred embodiment of the monolithic memory array, shows a memory array 10 having for example transistors $Q_1$, $Q_2$, $Q_3$, and $Q_4$ and the respective switchable amorphous storage elements $S_1$, $S_2$, $S_3$, and $S_4$. Each of the isolation transistors of the cells is an NPN bipolar transistor in an emitter follower configuration. The amorphous storage material is selected to have a high switching threshold voltage, namely greater than 10 volts. In the same monolithic structure are CMOS address buffers and decoder 12 for the row addressing and CMOS buffers and decoder 14 for the column addressing. Whereas the row addressing 12 directly drives the base of the isolation transistors $Q_1$, $Q_2$, $Q_3$, and $Q_4$, the column addressing 14 drives an MOS transmission gate per column, illustrated as $Q_5$ and $Q_6$. The output circuits includes a CMOS sensing amplifier and output buffers 16. The signal terminals CE represents the clock enable which reduces the static power consumption of the monolithic array.

The use of bipolar transistors as the isolation device for each cell, reduces the amount of overall area required per cell, since bipolar devices have greater capacity for current and voltage per unit area than MOS devices. Also the use of NPN emitter followers in the array eliminates cell isolation and reduces the area required per cell. By combining CMOS address buffers, decoders and output circuits, and a clocked operation, the static power consumption normally encountered when using bipolar transistors is substantially eliminated. More specifically no static power is consumed in the row or column addressing, the matrix or the sense amplifiers and output buffers. This condition is the result of using CMOS inputs to the matrix array 10 and CMOS interface to the output sense amplifers and buffer 16 in conjunction with the clocked operation. For static operation (unclocked), the only static power consumed by the total circuit would be the static read power through the matrix. No power would be consumed by the input and output circuits.

To meet the high temperature environmental requirements (up to 125° C. ambient) the amorphous storage devices $S_1$, $S_2$, $S_3$, and $S_4$, must be of high threshold voltages (namely 10-15 volts). The Write/Erase lifetime degrades very rapidly with increasing temperatures unless high threshold material is used. It should be noted that although switchable amorphous materials are being described for use in the present circuit, the circuit has a capability of being used with other high threshold elements, for example fuse elements.

To reduce the overall surface area required per cell, NPN bipolar transistors in an emitter follower configuration are used. These transistors having a common collector positively biased to provide their own isolation between cells and require no additional isolation structure or steps in manufacturing to produce such isolation structure. The general NPN transistor of the prior art has a substantially low emitter to base breakdown voltage, for example approximately 7 volts, and consequently could not be used with the high threshold voltage amorphous material needed to meet the temperature requirements discussed above. Thus to take advantage of the minimum space requirements of an NPN bipolar transistor in an emitter follower configuration, the NPN transistor of FIG. 2 should be used. The transistor includes the common collector or substrate material 20 being of $N^-$ conductivity type and having a surface inpurity concentration of approximately $10^{16}$ atoms/$CM^3$. A $P^-$ conductivity type base region 22 is formed in the common collector region 20 having a surface impurity concentration of approximately $10^{16}$ atoms/$CM^3$. An $N^+$ conductivity type of emitter region 24 is formed in the base region 22 having a surface impurity concentration of approximately $5 \times 10^{19}$ atoms/$CM^3$ and a sheet resistance of approximately 25 ohms/square. A $P^+$ conductivity type base contact region 26 is formed bridging the base region 22 and the substrate collector region 20. The $P^+$ conductivity type contact region 26 having a surface impurity concentration of approximately $3 \times 10^{19}$ atoms/$CM^3$ and a sheet resistance of approximately 20 ohms/square allows for a low resistance contact to the base region via metal 28. The emitter 24 is connected via first metal 30 to the amorphous material 32. A second metal 34 engages the top of the amorphous material 32. An oxide layer 36 separates the first metal 30 from the substrate and an insulative layer 38 separates the second metal 34 from the first metal. It should be noted that the base contact metal 28 runs orthogonal to the amorphous or second metal 34.

A process for fabricating the $P^-$ base and $N^+$ emitter regions with a common collector in an integrated circuit with CMOS devices is described in U.S. patent application Ser. No. 782,694 filed Mar. 30, 1977 to James D. Beasom, which is incorporated herein by reference.

Figure 2:
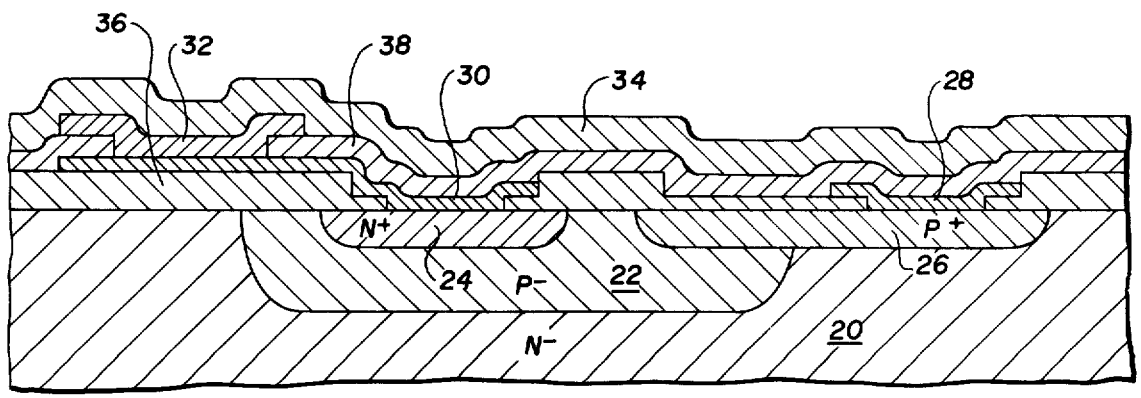
FIG. 2 is a cross-section of an integrated circuit illustrating an improved NPN emitter follower cell configuration incorporating the principles of the present invention.

By using the $P^-$ base and $N^+$ emitter, the reverse emitter-base breakdown voltage of the NPN transistor FIG. 2 is approximately 25 volts. Thus it can be readily used with high switching threshold voltage amorphous materials (i.e., greater than ten volts). It should also be noted that the NPN transistor of FIG. 2 is capable of handling the high resetting current required for the amorphous elements, namely currents in the order of 30 milliamperes. The $P^+$ base, $N^+$ emitter ($P^+/N^+$) emitter followers of the prior art typically have a beta of approximately 50 at one milliampere and as little as 2 or 3 at 30 milliamperes. Thus the base drive required for a $P^+/N^+$ emitter follower would necessitate substantial drive capability from the word line driver. This would require a device occupying substantial surface area. The beta of the $P^-/N^+$ emitter follower of FIG. 2 is approximately 500 at 1 milliampere and 50 at 30 milliamperes. Thus a relatively small device is capable of driving the word line.

Figure 3:
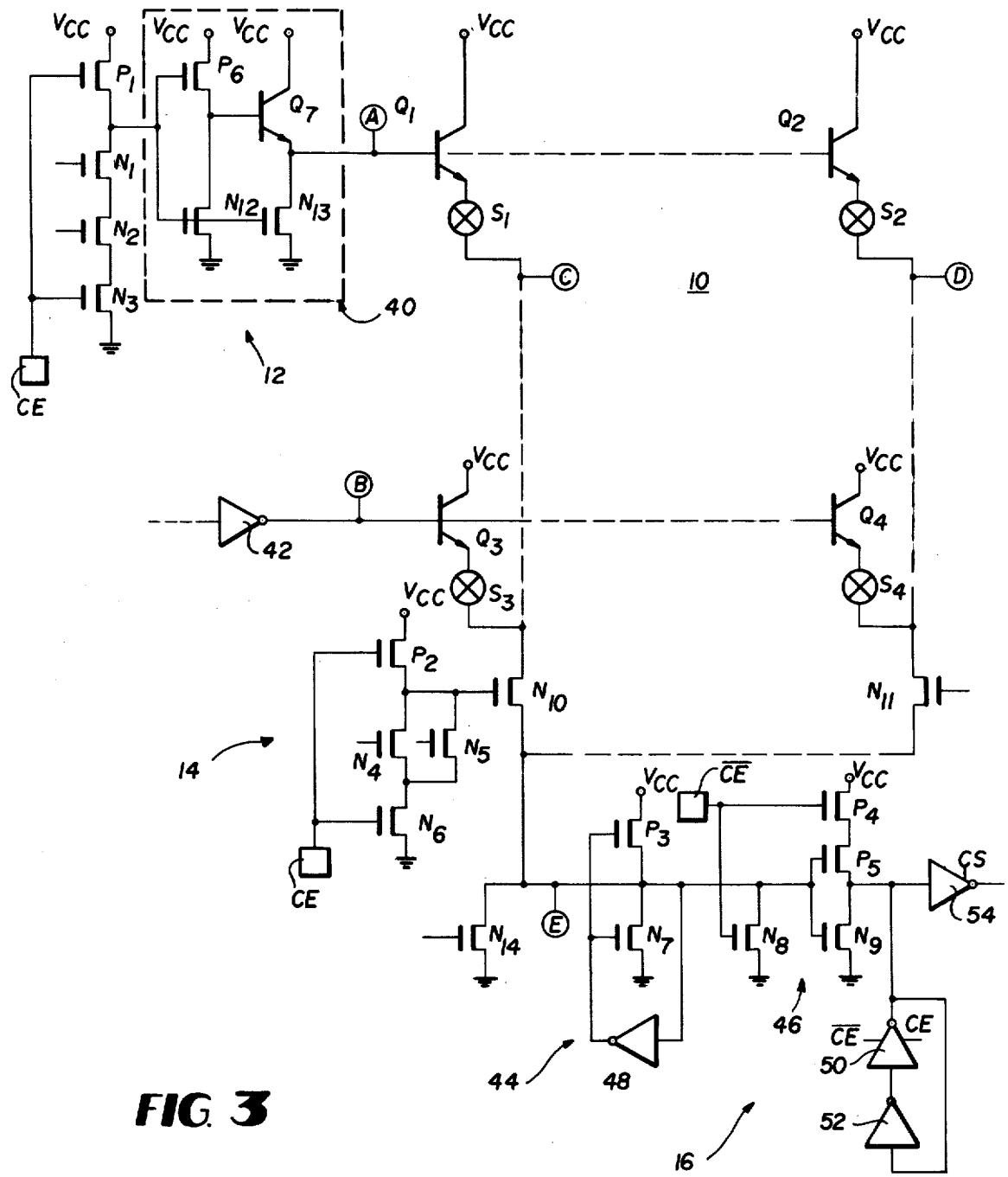
FIG. 3 is a schematic representing one embodiment of the block diagram of FIG. 1 incorporating the principles of the present invention.

A more detailed schematic of an embodiment of the present invention is illustrated in FIG. 3. The row addressing circuit 12 includes a CMOS decoder having MOS transistors $P_1$, $N_1$, $N_2$, and $N_3$. While $P_1$ and $N_3$ are clock enabled, $N_1$ and $N_2$ provide the row addressing. The CMOS row buffers include a bipolar output stage so as to increase the speed and power capabability of the buffer while minimizing surface area required. The buffer includes an input inverter having MOS transistors $P_6$ and $N_{12}$. The output stage includes an emitter follower NPN transistor $Q_7$ and an MOS transistor $N_{13}$. The base of the transistor $Q_7$ is connected to the output of the input CMOS inverter and the gate of the output MOS device $N_{13}$ is connected to the input of the CMOS inverter. The output of the buffer at the emitter of $Q_7$ drives the bases of the NPN emitter follower elements of the isolation devices of the cell in its respective row. As illustrated in FIG. 3 this includes transistors $Q_1$ and $Q_2$. The row buffer bipolar transistor (for example $Q_7$)

and the cell bipolar transistors (for example $Q_1$ and $Q_2$) are connected in a Darlington configuration. This allows very fast AC operation and provides the extra current needed during writing or programming of the storage devices. Once the array or cell emitter follower saturates, the row driver emitter follow provides the extra current needed for programming through the base of the array emitter follower.

The column addressing 14 includes a CMOS decoder having MOS transistors $P_2$, $N_4$, $N_5$ and $N_6$. MOS transistors $P_2$ and $N_6$ are clock enabled while MOS devices $N_4$ and $N_5$ provide the column addressing or decoding. An MOS device $N_{10}$ provides the column selection and is driven by a respective column decoder. A second column MOS device $N_{11}$ is also illustrated.

The output circuit 16 includes a CMOS sense amplifier 44 and an output buffer and latch 46. The CMOS sense amplifier includes CMOS inverter $P_3$ and $N_7$ having its input connected to its output via a CMOS inverter 48. The ORed output of the column switches $N_{10}$ and $N_{11}$ are connected to the junction of the drains of $P_3$ and $N_7$. The output buffer and latch 46 includes MOS devices $P_4$, $P_5$, $N_8$ and $N_9$. The clock enable is connected to the gates of $P_4$ and $N_8$ and the output of the sense amplifier is connected to the input of the CMOS inverter configured $P_5$ and $N_9$. A serial pair of inverters 50 and 52 are connected with the output of the CMOS inverter $P_5$ and $N_9$ and to the input of an output buffer inverter 54. CMOS inverter 50 is logically controlled by the clock enable and the inverse of the clock enable signal. The output buffer and inverter 54 is controlled by the Chip Select signal CS. A programming MOS device $N_{14}$ is connected to the ORed sources of the column select devices $N_{10}$ and $N_{11}$.

The read operation can be more fully understood by referring to FIG. 3. CE is an external clock which is buffered as necessary for loading conditions. Whenever CE is low, the circuit is in a precharge state. All word lines (e.g., A & B) are low (gnd). All bit lines are low (gnd) and the OR tie E is low (gnd). The output is latched and enabled or tri-stated as desired. The row and column address buffers will be latched whenever CE goes from low to high. When row decode input to buffer 40 is high, $N_{12}$ and $N_{13}$ are on and $P_6$ and $Q_7$ are off. Word line A is low and thus $Q_1$ and $Q_2$ are off. When row decode input to buffer 40 is low, $P_6$ and $Q_7$ are on and $N_{12}$ and $N_{13}$ are off. Word line A is high and thus $Q_1$ or $Q_2$ is on depending upon the column addressing of $N_{10}$ and $N_{11}$.

Assume that amorphous element $S_1$ will be selected (word line A and bit line C) and is low impedance (approximately 200 ohms). Whenever CE goes from low to high, $N_1$, $N_2$ & $N_3$ will be turned on and word line A will be raised to VCC−1 VBE. All bit lines associated with word line A whose amorphous element is a low impedance will be raised to VCC−2 VBE. All deselected transmission gates (represented by $N_{11}$) will be turned off by the column address inputs. The column addresses for $N_{10}$ (represented by $N_4$ and $N_5$) will be low (only one column address will have all inputs low) and $N_{10}$ will remain on (it was previously on during the precharge). OR tie E will be pulled up to VCC−2 VBE. $N_8$ will be turned off by CE and the output will be unlatched. $N_7$ is made to be a very small load device. The current available from the selected bit line readily exceeds its saturation current. Point E being high (VCC−2 VBE) provides a low to the inputs of $P_3$ and $N_7$. $N_7$ turns off and $P_3$ on. $P_3$ raises E to VCC and $N_{10}$ turns off. The input to the output buffer 54 is low and the output is high (unlatched) or tri-stated as desired. Whenever CE then goes from high to low, the output latch is set and the circuit is again in the precharge state. The previous high at E is pulled down to a low by $N_8$ ($N_8$ is scaled to overcome $P_3$).

Whenever the selected Amorphous element is a high impedance (e.g., 10 megohm), point E, which has been pre-charged low, will be maintained low by $N_7$. The input to the output buffer 54 will be high and the output low or tri-state as desired.

Conventional static operation can readily be obtained by utilizing conventional row and column decoding and a single load device at E. The amount of static read current would be set by the design of the load device. Output buffering can be supplied as needed from AC & DC considerations.

For setting and resetting the amorphous elements in the memory array, the row and column selection is made identical to the read mode just described. VCC is raised to approximately 20 volts. The selected matrix isolation device, $Q_1$ for example, will saturate due to the parasitic collector impedance. Drive transistor or output structure of the input buffer $Q_7$ being a bipolar transistor is capable of providing the 3 to 4 milliamperes required to drive the matrix isolation bipolar transistor $Q_1$. Also by it being a bipolar device, $Q_7$ occupies substantially less area than an MOS device of the same capacity. It should be noted that the bipolar output stage of the buffer, namely $Q_7$, and the selected bipolar isolation device of the matrix for example $Q_1$, form a Darlington arrangement in both the read mode and the programming mode to provide extra base current to the matrix bipolar device. For resetting, $N_{14}$ is pulse with a voltage of approximately 20 volts to supply a reset current $I_1$ through the selected amorphous device. The reset current, for example, through storage device $S_1$ is from the VCC terminal through $Q_7$, $Q_1$, $N_{10}$ and $N_{14}$. $P_6$ drives $Q_7$ and $Q_7$ in turn drives $Q_1$. For setting the amorphous device, for example $S_1$, the procedure is the same except that $N_{14}$ is pulsed and supplied with a voltage of approximately 5 volts to provide a set current $I_2$. Even though a single device $N_{14}$ is shown, two separate NMOS devices may be provided having the separate design characteristics to accomodate the set and reset voltages to produce the set and reset currents respectively. The voltage applied across the selected storage device must be sufficient to cause the device to fire or switch and the current must of a sufficient magnitude and duration to cause the amorphous device to set or reset as desired.

The present invention by designing for amorphous material elements with a threshold of greater than 10 volts provides reliable high operating temperature performance. The use of CMOS circuitry provides minimum power consumption and its integration with bipolar transistors minimizes the surface area required to provide the high current and voltages required to drive the amorphous devices. The unique P−/N+ emitter follower of the NPN bipolar isolation device in the array reduces the overall surface area per cell and has the capability of supporting the programming currents for the higher threshold voltage amorphous materials. The present invention has achieved dynamic power dissipation of less than 50 milliwatts with circuit speeds in the range of 50 to 60 nanoseconds. This circuit permits the use of conventional packaging schemes while maintaining the die temperature at approximately 4° C.

above ambient temperature. As previously mentioned even though amorphous material devices are described as the storage device, the circuit of the present invention using CMOS technology and selected bipolar transistors can also be used with other storage and programmable elements, for example fuses.

In the preceding description of the preferred embodiments, it is evident that the objects of the invention are attained and although the invention has been described and illustrated in detail, it is to be clearly understood that the same is by way of illustration and example only and is not to be taken by way of limitation. The spirit and scope of the invention being limited only by the terms of the appended claims.

What is claimed is:

1. A monolithic electrically alterable read only memory comprising:
    an array of memory cells each including an electrically alterable device and a bipolar transistor in an emitter follower configuration;
    row drivers, connected to the bases of said cell transistors, each including a CMOS inverter as its input and an NPN bipolar transistor in an emitter follower configuration as its output, the emitter of the output NPN transistor being connected to the bases of said cell transistors in a given row;
    CMOS column drivers and transmission gates; and
    CMOS output means.

2. The memory of claim 1 wherein said row drivers further include an N channel MOS having its gate connected to the gate of the input inverter and its drain connected to the emitter of said output NPN transistor.

3. The memory of claim 1 wherein each of said cell transistors has a P− base region and an N+ emitter region.

4. The memory of claim 3 wherein said cell transistors are NPN and an N conductivity type substrate forms a common collector for said cell transistor, and including means for biasing said substrate positive.

5. The memory of claim 1 wherein said electrically alterable device is a switchable amorphous material device.

6. The memory of claim 5 wherein said switchable amorphous device has a switching threshold of greater than ten volts and said cell transistors are NPN with an emitter to base breakdown voltage of greater than twenty volts.

7. The memory of claim 1 wherein said electrically alterable device is a fuse.

8. In an electrically alterable memory array having CMOS row and column addressing buffers and CMOS output buffers and each cell including an electrically alterable device and an isolation device, the improvement comprising:
    said row addressing buffers each include a bipolar transistor in an emitter follower configuration as an output stage;
    said electrically alterables device having a switching threshold of greater than ten volts; and
    said isolation devices being NPN bipolar transistors in an emitter follower configuration with an emitter to base breakdown voltage of greater than twenty volts.

9. The memory of claim 8 wherein all of said NPN transistors have a common collector and including means for biasing said common collector positive.

10. The memory of claim 8 wherein said NPN transistors having their bases connected to a respective emitter of said buffer transistors and means biasing said memory in a read mode and a programming mode for driving a selected NPN and buffer bipolar transistor as a Darlington amplifier.

11. The memory of claim 8 wherein said electrically alterable device is a switchable amorphous material device.

12. The memory of claim 8 wherein said input buffer includes a CMOS inverter as an input stage, said buffer transistor is an NPN transistor and said output stage includes an N channel MOS having its gate connected to the input of said inverter and its drain connected in series with the emitter of said output transistor.

13. The memory of claim 8 wherein each NPN transistor includes an N-type collector region, a P-type base region formed in said collector region having a surface impurity concentration of approximately $10^{16}$ atoms per cubic centimeter and an N-type emitter region formed in said base region having a surface impurity concentration of approximately $5 \times 10^{19}$ atoms per cubic centimeter.

14. The memory of claim 13 including a base contact region formed across a boundry of said base and collector region having a surface impurity concentration of approximately $3 \times 10^{19}$ atoms per cubic centimeter.

15. A monolithic electrically alterable memory comprising:
    an array of memory cells each including an electrically alterable device and an NPN bipolar transistor in an emitter follower configuration;
    row drivers, each including CMOS devices and an NPN bipolar transistor output element in an emitter follower configuration, said row driver NPN transistor and respective array NPN transistors being connected in a Darlington configuration;
    CMOS column drivers and transmission gates; and
    CMOS output means.

16. The memory of claim 15 wherein said switchable amorphous device has a switching threshold greater than ten volts and cell NPN transistors have an emitter to base breakdown voltage of greater than 20 volts.

17. An integrated digital buffer comprising:
    a CMOS inverter input circuit including a first P channel MOS and a first N channel MOS having their gates connected together as the buffer input and their sources and drains connected in series between a first and second power supply terminals,
    an output circuit including a NPN transistor having its base connected to the interconnection of the drains of said first MOS devices, its collector connected to said first power supply terminal and its emiiter as the buffer output, and a second N channel MOS having its gate connected to the buffer input, its drain connected to the emitter of said NPN transistor and its source connected to said second power supply terminal.

* * * * *